(12) United States Patent  (10) Patent No.: US 8,268,713 B2
Yamagishi et al. (45) Date of Patent: Sep. 18, 2012

(54) METHOD OF MANUFACTURING NONVOLATILE MEMORY DEVICE

(75) Inventors: Hajime Yamagishi, Kanagawa (JP); Mitsuharu Shoji, Kanagawa (JP); Kiyotaka Tabuchi, Kumamoto (JP)

(73) Assignee: Sony Corporation, Tokyo (JP)

( * ) Notice: Subject to any disclaimer, the term of this patent is extended or adjusted under 35 U.S.C. 154(b) by 55 days.

(21) Appl. No.: 12/869,904

(22) Filed: Aug. 27, 2010

(65) Prior Publication Data

US 2011/0059557 A1 Mar. 10, 2011

(30) Foreign Application Priority Data

Sep. 4, 2009 (JP) ................................ 2009-204528

(51) Int. Cl.
*H01L 21/44* (2006.01)
(52) U.S. Cl. ....... 438/608; 438/3; 438/95; 257/E21.665; 257/E21.643
(58) Field of Classification Search .............. 438/3, 608, 438/2, 584, 95, 257, 265, FOR. 189, FOR. 212, 438/FOR. 405, FOR. 409; 257/E21.665, 257/E21.663, E21.643, E31.029
See application file for complete search history.

(56) References Cited

U.S. PATENT DOCUMENTS

| 6,165,803 A * | 12/2000 | Chen et al. ........................ 438/3 |
| 6,759,263 B2 * | 7/2004 | Ying et al. ....................... 438/48 |
| 7,001,777 B1 * | 2/2006 | Adelerhof et al. ................. 438/3 |
| 7,220,669 B2 * | 5/2007 | Hujanen et al. ............... 438/650 |
| 2002/0036876 A1 * | 3/2002 | Kawawake et al. ........ 360/324.1 |
| 2002/0176277 A1 * | 11/2002 | Bessho et al. .................. 365/171 |
| 2006/0219267 A1 * | 10/2006 | Bailey et al. ................. 134/22.1 |

FOREIGN PATENT DOCUMENTS

| JP | 2003-017782 | 1/2003 |
| JP | 2003-505873 | 2/2003 |
| JP | 2003-068983 | 3/2003 |
| JP | 2003-078185 | 3/2003 |
| JP | 2005-166976 | 6/2005 |
| JP | 2005-197634 | 7/2005 |
| JP | 2005-322942 | 11/2005 |
| JP | 2006-520105 | 8/2006 |
| JP | 2007-134676 | 5/2007 |

* cited by examiner

*Primary Examiner* — Olik Chaudhuri
*Assistant Examiner* — Quovaunda V Jefferson
(74) *Attorney, Agent, or Firm* — SNR Denton US LLP

(57) ABSTRACT

A method of manufacturing a nonvolatile memory device having a laminated structure in which a first magnetic material layer, a tunnel insulator film, and a second magnetic material layer are sequentially laminated, in which information is stored when an electric resistance value changes depending on a magnetization reversal state is disclosed. The method includes the steps of: sequentially forming the first magnetic material layer, the tunnel insulator film, and the second magnetic material layer; forming a mask layer on the second magnetic material layer; oxidizing a part uncovered by the mask layer of the second magnetic material layer; and reducing the oxidized part of the second magnetic material layer.

8 Claims, 10 Drawing Sheets

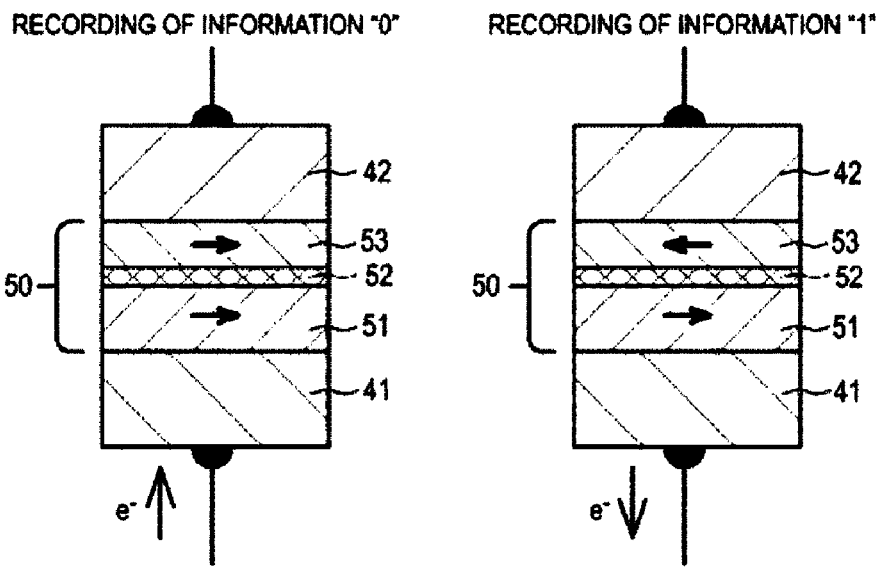
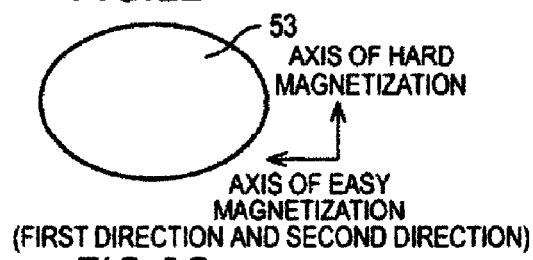
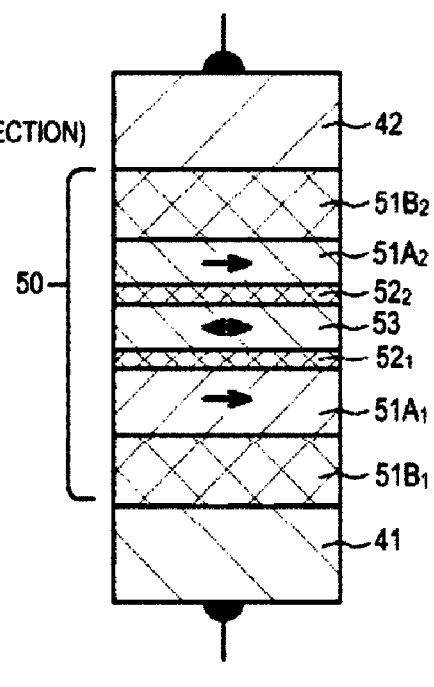
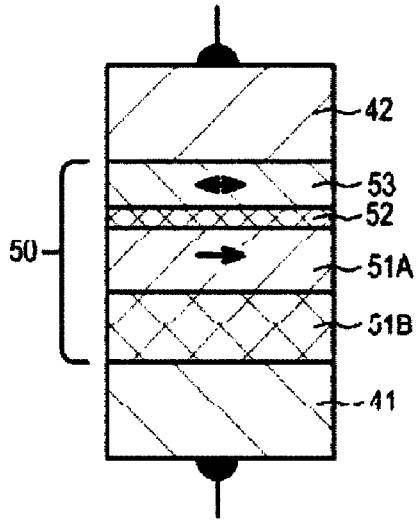

[STEP-120]

[STEP-130]

[STEP-140]

[STEP-140] (CONTINUED)

[STEP-150]

[STEP-160]

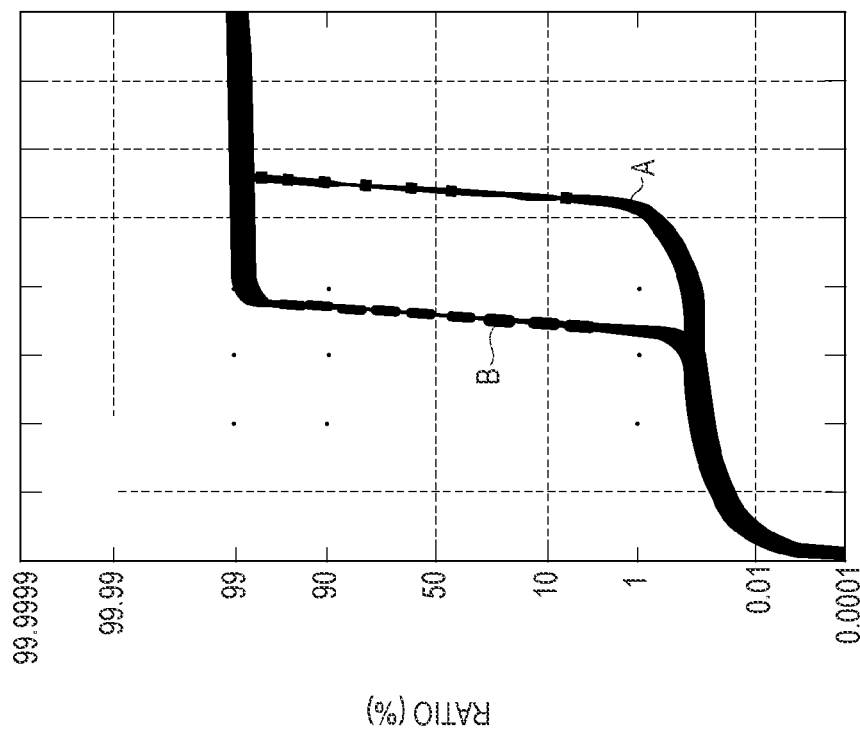
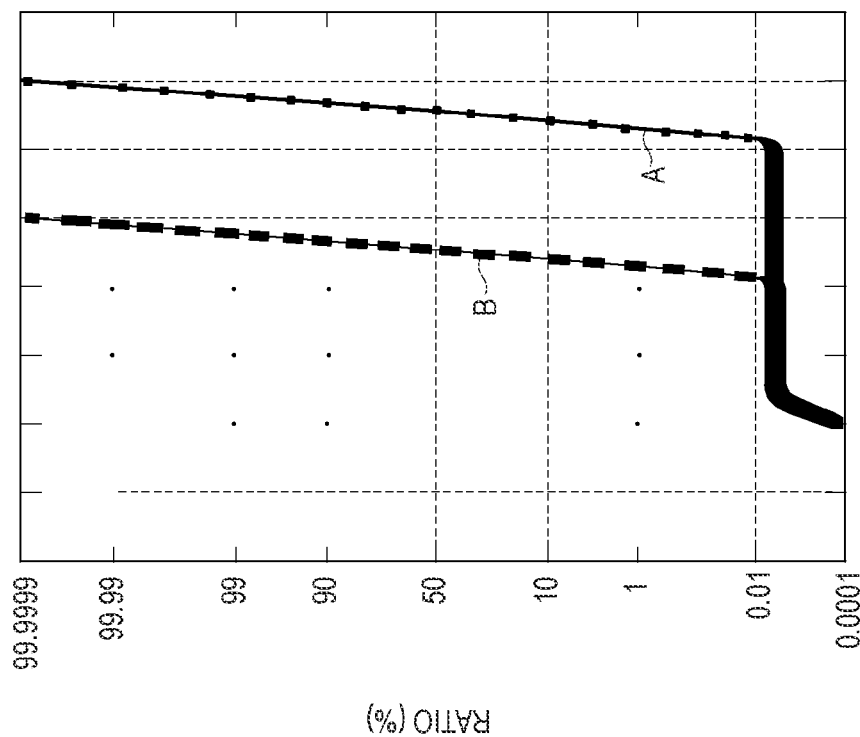

[STEP-320]

[STEP-320] (CONTINUED)

[STEP-330]

[STEP-330] (CONTINUED)

[STEP-330] (CONTINUED)

METHOD OF MANUFACTURING NONVOLATILE MEMORY DEVICE

BACKGROUND OF THE INVENTION

1. Field of the Invention

The present invention relates to a method of manufacturing a nonvolatile memory device.

2. Background Art

With the remarkable proliferation of information communications equipment, particularly, personal small items such as portable terminals, various kinds of semiconductor devices of memory devices and logic devices forming the equipment are requested to have higher performance of higher integration, higher speed, lower power consumption, and the like. Especially, a nonvolatile memory is considered to be indispensable for the ubiquitous age. Even in exhaustion or trouble of a power supply, or disconnection between a server and a network due to some failure, important information can be saved and protected by the nonvolatile memory. Further, the recent portable equipment is designed to suppress the power consumption as much as possible by allowing an unnecessary circuit block to stand by. If a nonvolatile memory serving as a high-speed work memory and a large-capacity storage memory can be realized, wasted power consumption and memory can be eliminated. In addition, the "instant-on" function that enables instantaneous activation when the power is turned on can be exerted if the high-speed and large-capacity storage nonvolatile memory can be realized.

As the nonvolatile memory, a flash memory using a semiconductor material and a ferroelectric random access memory (FERAM) using a ferroelectric material, and the like may be cited. However, the flash memory has a disadvantage with a slow writing speed in the order of microseconds. On the other hand, in the FERAM, the rewritable times is $10^{12}$ to $10^{14}$. The problems that the rewritable times of the FERAM are not sufficient for replacement of an SRAM or DRAM with the FERAM, and microfabrication of the ferroelectric layer is difficult are pointed out.

As a nonvolatile memory device that does not have these disadvantages, a nonvolatile memory device called an MRAM (magnetic random access memory) attracts attention. Among the MRAMs, an MRAM using a TMR (tunnel magnetoresistance) effect attracts a lot of attention because of the recent improvement in characteristics of the TMR material. The TMR-type MRAM has a simple structure and is easy to be scaled, and has many rewritable times because recording is performed by the rotation of magnetic moment. Furthermore, a very high speed is expected with respect to the access time, and it is said that the MRAM has already been operable at 100 MHz.

Now, in the MRAM, in order to stably hold the recorded information, it is necessary that the recording layer for recording information has a certain coercive force. On the other hand, in order to rewrite the recorded information, a certain degree of current should be flown in the bit-line. However, with the miniaturization of the MRAM, the bit-line becomes thinner, and it is becoming difficult to flow a sufficient current. Accordingly, as a configuration capable of magnetization reversal with a smaller current, a spin injection magnetoresistance-effect device using magnetization reversal by spin injection attracts attention (e.g., see JP-A-2003-017782). Here, the magnetization reversal by spin injection is a phenomenon that electrons spin-polarized through a magnetic material are injected into another magnetic material, and thereby, magnetization reversal occurs in the other magnetic material. In the spin injection magnetoresistance-effect device, compared to the MRAM, the device structure can be made simpler. Further, since the magnetization reversal by spin injection is utilized, compared to the MRAM in which magnetization reversal is performed by an external magnetic field, the device has advantages that the writing current is not increased even when the miniaturization of the device is advanced and that the cell area can be reduced.

A nonvolatile memory device including a spin injection magnetization reversal writing system has a structure (referred to as "MTJ structure") in which a tunnel insulator film in thickness of about 1 nm is sandwiched between two magnetic material layers (a recording layer also called a magnetization free layer and a magnetization reference layer called a magnetization fixed layer). Further, for practical application of the nonvolatile memory device having the MTJ structure, a process technology of patterning the magnetic material layer without occurrence of damage, short circuit, or current leak is necessary. However, since a transition metal magnetic material is often used for the materials forming the magnetic material layer, in a metal etching technology using a halogen gas used for the etching process of the widely used silicon semiconductor device, it may be impossible to easily etch the magnetic material layer. In addition, it is difficult to etch the magnetic material layer without occurrence of short circuit or current leak in the tunnel insulator film as extremely thin as about 1 nm.

Accordingly, study on a reactive ion etching (RIE) method using a non-halogen gas is conducted. However, since the RIE method has a physical etching element, it is highly likely that the etched material is reattached to the side wall of the tunnel insulator film and short circuit and current leak occur. Further, it is difficult to avoid the occurrence of damage in the MTJ structure of the nonvolatile memory device, and that may be a major factor causing variations in properties.

For patterning of the magnetic material layer, the ion beam etching method has been also used in related art. In the method, although the magnetic material layer is less damaged, the reattachment of the etched material is the most serious issue. Especially, since the tunnel insulator film is as extremely thin as about 1 nm, there is a problem that occurrence of short circuit and current leak due to the reattachment of the etched material at a certain rate is unavoidable.

As measures for solving the above described problems, a technology, at patterning of the MTJ structure, of deteriorating the conductivity by quitting the etching of the magnetic material layer formed on the tunnel insulator film (referred to as "upper magnetic material layer") in the middle and oxidizing a part of the upper magnetic material layer with a portion of the upper magnetic material layer left is known from JP-T-2003-505873 (the term "JP-T" as used herein means a published Japanese translation of a PCT patent application), JP-A-2003-078185, and JP-T-2006-520105. In these technologies, the etching surface does not reach the tunnel insulator film, and thus, no etched material is reattached to the side wall of the tunnel insulator film and occurrence of the problems of short circuit and current leak can be avoided.

Alternatively, as the nonvolatile memory device, a resistance change memory device including a phase change RAM (PRAM) is proposed. The nonvolatile memory device has a structure in which a resistance change layer that functions as a memory part is arranged between upper and lower electrodes, has a simple memory structure, and can easily be miniaturized. The phase change memory device as a kind of the resistance change memory device is a nonvolatile memory device that operates as a memory device using difference of several digits of electric resistance between the amorphous state and the crystal state of the phase change material forming the resistance change layer (for example, see JP-A-2007-134676). Further, there is a nonvolatile memory device that stores data using colossal electro-resistance effect (CER effect) of the material forming the resistance change layer has as a kind of the resistance change memory device (for example, see JP-A-2003-068983). Alternatively, there is a nonvolatile memory device in which the resistance change layer is formed by an ionic conductor containing a metal as a kind of the resistance change memory device (for example, see JP-A-2005-166976 and JP-A-2005-197634). Furthermore, a PMC (Programmable metallization Cell) is known as a kind of the resistance change memory device (for example, see JP-A-2005-322942).

In the resistance change memory device, in patterning of the resistance change layer, it is highly likely that the etched material is reattached to the side wall of the resistance change layer and short circuit and current leak occur.

SUMMARY OF THE INVENTION

However, in the oxidation technologies disclosed in the above described patent documents, control of oxidation in the depth direction is difficult. Further, even when the oxidation power and the film thickness are appropriately adjusted, due to the process temperature in the manufacturing process after the oxidation process of the nonvolatile memory device having the MTJ structure or the like, excessive oxygen remaining in the upper magnetic material layer may be thermally diffused and may cause damage on the magnetic material layer. In view of the productivity, it is necessary to perform necessary and sufficient oxidation treatment, and the situation that excessive oxygen remains is unavoidable.

In the resistance change memory device, it may be possible to apply the oxidation technologies disclosed in the above described patent documents to the patterning of the resistance change layer. However, due to the process temperature in the manufacturing process after the oxidation process of the resistance change memory device or the like, excessive oxygen remaining in the resistance change layer may be thermally diffused and may cause damage on the resistance change layer.

Accordingly, it is desirable to provide a method of manufacturing a nonvolatile memory device on which patterning of an MTJ structure in the nonvolatile memory device can be performed without causing short circuit or current leak or damage on the MTJ structure. Further, it is desirable to provide a method of manufacturing a nonvolatile memory device on which patterning of a resistance change layer in the resistance change memory device can be performed without causing short circuit or current leak or damage on the resistance change layer.

A first embodiment of the present invention is directed to a method of manufacturing a nonvolatile memory device having a laminated structure in which a first magnetic material layer, a tunnel insulator film, and a second magnetic material layer are sequentially laminated, in which information is stored when an electric resistance value changes depending on a magnetization reversal state. The method includes the steps of:

sequentially forming the first magnetic material layer, the tunnel insulator film, and the second magnetic material layer;

forming a mask layer on the second magnetic material layer;

oxidizing a part uncovered by the mask layer of the second magnetic material layer; and reducing the oxidized part of the second magnetic material layer.

A second embodiment of the present invention is directed to a method of manufacturing a nonvolatile memory device in which information is stored when an electric resistance value of a resistance change layer changes. The method includes the steps of:

forming a mask layer on the resistance change layer;

oxidizing a part uncovered by the mask layer of the resistance change layer; and reducing the oxidized part of the resistance change layer.

The method of manufacturing a nonvolatile memory device according to the first embodiment of the invention includes the steps of oxidizing the part uncovered by the mask layer of the second magnetic material layer, and then, reducing the oxidized part of the second magnetic material layer, and the method of manufacturing a nonvolatile memory device according to the second embodiment of the invention includes the steps of oxidizing the part uncovered by the mask layer of the resistance change layer, and reducing the oxidized part of the resistance change layer. That is, instead of removing all of the unnecessary parts by patterning the second magnetic material layer and the resistance change layer using an etching method or the like, the functions (conductivity, magnetic property, etc.) of the second magnetic material layer and the resistance change layer are deteriorated by oxidation. Thus, it is difficult to cause damage on the regions (function regions) of the second magnetic material layer and the resistance change layer holding the functions. Further, since the oxidized part of the second magnetic material layer and the oxidized part of the resistance change layer are reduced, the problem that excessive oxygen remaining in the second magnetic material layer and the resistance change layer is thermally diffused and causes damage on the magnetic material layer and the resistance change layer due to the process temperature in the manufacturing process after the oxidation process of the nonvolatile memory device does not arises. That is, the deterioration of the function regions due to oxygen can be prevented. Note that, in the parts of the second magnetic material layer and the resistance change layer in which the functions (conductivity, magnetic property, etc.) have been deteriorated due to oxidation, the deteriorated functions are hardly restored (recovered) even by the reduction treatment. As a result, a nonvolatile memory device having high properties and long-term reliability can be provided.

BRIEF DESCRIPTION OF THE DRAWINGS

FIGS. 2A to 2D are conceptual diagrams showing a sectional structure of a laminated structure forming the nonvolatile memory device in example 1.

FIGS. 5A and 5B are graphs showing measurement results of a high readout resistance value and a low readout resistance value in the nonvolatile memory device of example 1 and a nonvolatile memory device in related art obtained by patterning of a second magnetic material layer, a tunnel insulator film, and a first magnetic material layer using an ion milling method, respectively.

DESCRIPTION OF PREFERRED EMBODIMENTS

Figure 1:
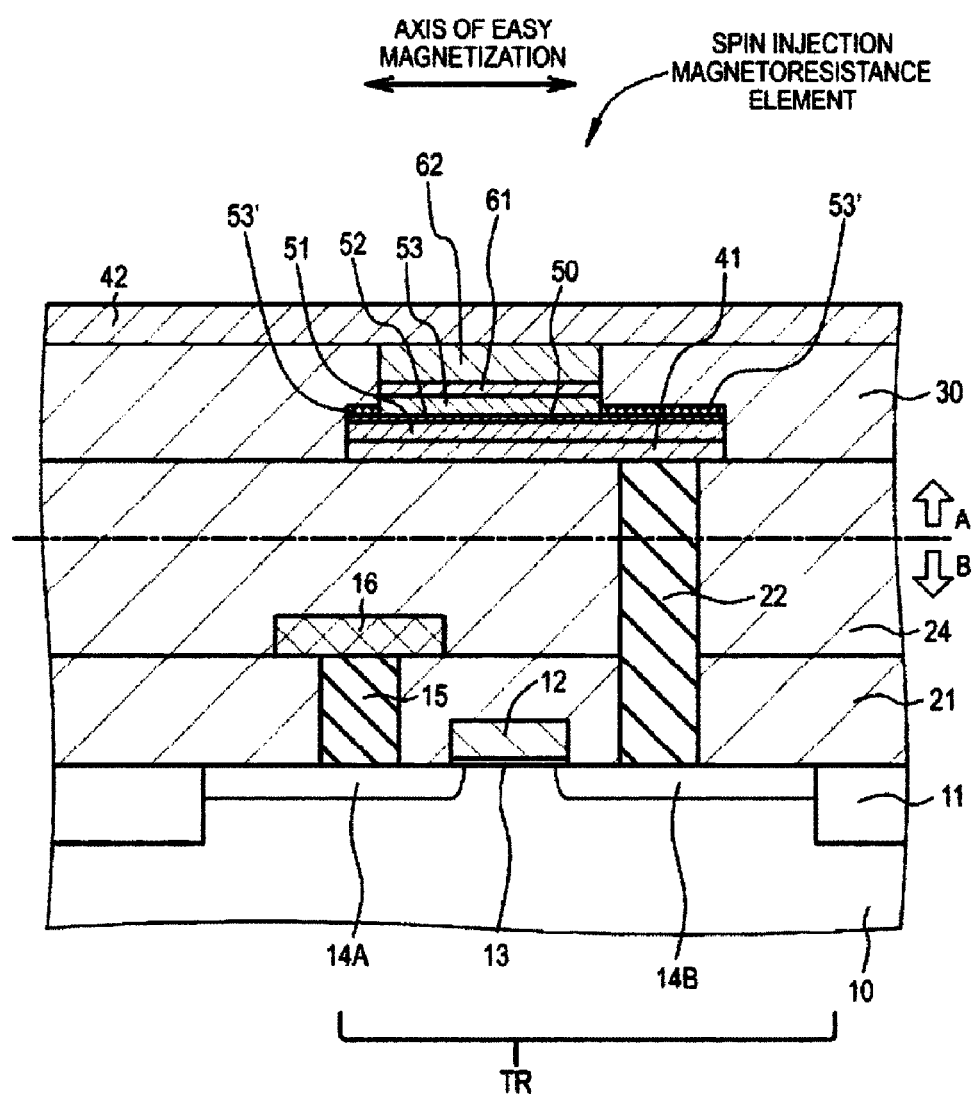
FIG. 1 is a schematic partial sectional view of a nonvolatile memory device obtained according to a method of manufacturing a nonvolatile memory device of example 1.

The embodiments of the invention will be described according to examples with reference to the drawings, and the embodiments of the invention are not limited to the examples and various numeric values and materials in the examples are shown for illustrative purpose. The explanation will be made in the following order.

1. General explanation of method of manufacturing nonvolatile memory device according to first embodiment and second embodiment of the invention
2. Example 1 (method of manufacturing nonvolatile memory device according to first embodiment of the invention)
3. Example 2 (modification of example 1)
4. Example 3 (method of manufacturing nonvolatile memory device according to second embodiment of the invention)
5. Example 4 (modification of example 3 and others)

General Explanation of Method of Manufacturing Nonvolatile Memory Device According to First Embodiment and Second Embodiment of the Invention In a method of manufacturing a nonvolatile memory device according to the first embodiment of the invention, a mode in which, after a mask layer is formed on a second magnetic material layer and before a part uncovered by the mask layer of the second magnetic material layer is oxidized, a portion of the part uncovered by the mask layer of the second magnetic material layer is etched in the thickness direction may be employed. However, not limited to that, but the part uncovered by the mask layer of the second magnetic material layer may not be etched. As methods of etching a portion of the part uncovered by the mask layer of the second magnetic material layer in the thickness direction, an ion milling method (also referred to as "ion beam etching method") and a reactive ion etching method (RIE method) may be exemplified. In this case, the mask layer functions as a mask for etching.

In the method of manufacturing a nonvolatile memory device according to the first embodiment of the invention including the preferred mode, a mode in which the first magnetic material layer includes a magnetization reference layer and the second magnetic material layer includes a recording layer may be employed, or, opposite to the configuration, a mode in which the first magnetic material layer includes a recording layer and the second magnetic material layer includes a magnetization reference layer may be employed.

Further, in the method of manufacturing a nonvolatile memory device according to the first embodiment of the invention including the various preferred modes, the part uncovered by the mask layer of the second magnetic material layer may be oxidized based on a plasma oxidation method, a thermal oxidation method, or a radical oxidation method, or oxygen may be injected by an ion injection method. Furthermore, it is preferable to reduce the oxidized part of the second magnetic material layer based on a hydrogen plasma method, and otherwise, a plasma reduction method using an ammonia gas, a radical reduction method using a hydrogen gas or ammonia gas, and a method of performing heating treatment in an atmosphere of a hydrogen gas or ammonia gas may be employed. The combination of the oxidation method and the reduction method is intrinsically arbitrary.

In the method of manufacturing a nonvolatile memory device according to the second embodiment of the invention, a mode in which a resistance change layer includes an ion conductor containing a metal may be employed. Alternatively, a mode in which the resistance change layer includes a chalcogenide material may be employed. Or, a mode in which the resistance change layer includes a material having colossal electro-resistance effect (CER effect) may be employed, and, in this case, specifically, the resistance change layer may include a perovskite containing material.

In the method of manufacturing a nonvolatile memory device according to the first embodiment or second embodiment of the invention, as a material forming the mask layer, $SiO_2$, SiN, SiC, SiON, SiCN may be exemplified. The mask layer may have a laminated configuration. The mask layer may be formed to also have a function of antireflection effect in the lithography process, etching stop, metal diffusion prevention, or the like. The mask layer may be formed by the CVD method, for example, and patterning of the mask layer may be performed based on the combination of a lithography technology and an etching technology.

The nonvolatile memory device obtained in the above described method of manufacturing a nonvolatile memory device according to the first embodiment of the invention including the preferred modes and configurations is a nonvolatile memory device having a so-called magnetoresistive effect. Note that such a nonvolatile memory device is referred to as "nonvolatile memory device of the first embodiment" for convenience. Here, the nonvolatile memory device of the first embodiment may include a tunnel magnetoresistive effect device (MRAM) of current magnetic field reversal system, or a spin injection magnetoresistive effect device (spin RAM) using magnetization reversal by spin injection. The latter device includes in-plane magnetization system and perpendicular magnetization system.

Of the nonvolatile memory devices of the first embodiment, in the tunnel magnetoresistive effect device of current magnetic field reversal system, as the planar shape of the second magnetic material layer that has not been oxidized, an oval shape, an oblong shape (a figure in combination of two semicircles and two line segments), a shape surrounded by a parabolic curve or hyperbolic curve, and, in a broad sense, a shape formed by a figure that can be expressed by a quadric function or cubic or higher order function, a regular polygon (including a rectangle, a regular polygon having five or more angles, a rectangle having rounded apexes, and a regular polygon having five or more angles and rounded apexes), a flattened circle (a figure formed by flattening a circle from one direction) may be cited, and the planar shape may include a combination of an oval shape and a line segment, a combination of a parabolic curve and a line segment, a combination of a hyperbolic curve and a line segment, and, in a broad sense, a combination of a quadric function and a linear function, a combination of a cubic or higher order function and a linear function. Alternatively, a curves shape is more preferable (specifically, for example, see JP-A-2005-353788). On the other hand, of the nonvolatile memory devices of the first embodiment, in the spin injection magnetoresistive effect device, as the planar shape of the second magnetic material layer that has not been oxidized, a circle may be cited.

In the nonvolatile memory devices of the first embodiment or the nonvolatile memory devices of the second embodiment, which will be described later, generally, a first wiring line or a first electrode is provided under the laminated structure or the resistance change layer, and an electrically connected second wiring line or second electrode is provided above the laminated structure or the resistance change layer. Further, a mode in which a selection transistor of a field-effect transistor (FET) is further provided below the laminated structure or the resistance change layer and the direction in which the second wiring line (for example, a bit-line) extends is in parallel to the direction in which the gate electrode forming the field-effect transistor extends may be employed, however, not limited to that, but a mode in which the projection image in the extending direction of the second wiring line is orthogonal to the projection image in the extending direction of the gate electrode forming the field-effect transistor may be employed. Further, in some cases, the selection transistor is not necessary.

Here, the spin injection magnetoresistance-effect device may have a configuration in which a laminated structure having a TMR effect is formed by a magnetization reference layer (also called an anchoring layer or a magnetization fixed layer), a tunnel insulator film, a recording layer for storing information (also called a magnetization reversal layer or a free layer). Note that a laminated structure having the TMR effect may be formed by the magnetization reference layer, the tunnel insulator film, the recording layer, the tunnel insulator film, and the magnetization reference layer. In such a structure, it is necessary to provide a difference between changes in magnetoresistances between the two tunnel insulator films located on and beneath the recording layer. The tunnel insulator film serves to break the magnetic coupling between the recording layer and the magnetization reference layer and flow a tunnel current. Further, the direction of magnetization in the recording layer is turned into a first direction (a direction in parallel to an axis of easy magnetization) or a second direction (the opposite direction to the first direction) by injecting a spin-polarized current into the recording layer, and thus, information is written in the recording layer (in-plane magnetization system). Alternatively, when the spin-polarized current is flown from the recording layer to the magnetization reference layer, spin-polarized electrons are injected from the magnetization reference layer into the recording layer and the magnetization direction of the magnetization reference layer and the magnetization direction of the recording layer are arranged in parallel, and, when the spin-polarized current is flown from the magnetization reference layer to the recording layer, the spin-polarized electrons flow from the recording layer to the magnetization reference layer, the electrons having spins in parallel to the magnetization reference layer are transmitted and the electrons having antiparallel spins are reflected, and consequently, the magnetization direction of the recording layer and the magnetization direction of the magnetization reference layer are arranged in the antiparallel fashion (perpendicular magnetization system).

As materials forming the recording layer and the magnetization reference layer, ferromagnetic materials such as nickel (Ni), iron (Fe), and cobalt (Co), alloys of the ferromagnetic materials (e.g., Co—Fe, Co—Fe—Ni, Fe—Pt, Ni—Fe, etc.), alloys formed by mixing nonmagnetic elements (e.g., tantalum, boron, chromium, platinum, silicon, carbon, nitrogen, etc.) in these alloys (e.g., Co—Fe—B etc.), oxides containing one or more of Co, Fe, Ni (e.g., ferrite: Fe—MnO etc.), a group of intermetallic compounds called half metallic ferromagnetic materials (Heusler alloys: NiMnSb, $Co_2MnGe$, $Co_2MnSi$, $Co_2CrAl$, etc.), oxides (e.g., $(La,Sr)MnO_3$, $CrO_2$, $Fe_3O_4$, etc.) may be cited. Or, alloys formed by adding gadolinium (Gd) to the alloys may be exemplified. Further, in order to further increase the perpendicular magnetic anisotropy, a heavy rare earth such as terbium (Tb), dysprosium (Dy), or holmium (Ho) may be added to the alloys, or alloys containing them may be laminated. The crystallinity of the recording layer and the magnetization reference layer is inherently arbitrary, and it may be polycrystal, single-crystal, or amorphous. Further, as a material forming the magnetization reference layer, in addition to the above described materials, for example, Co—Tb, Co—Pt may be cited. Furthermore, the magnetization reference layer may have a configuration having a laminated ferrimagnetic structure [a laminated structure having antiferromagnetic coupling, also called a synthetic antiferromagnet (SAF)] or may have a configuration having a magnetostatic coupling structure, or an antiferromagnetic material layer may be provided adjacent to the magnetization reference layer. By providing the antiferromagnetic material layer adjacent to the magnetization reference layer, strong unidirectional magnetic anisotropy can be obtained by the exchange interaction acting between the two layers. The laminated ferrimagnetic structure refers to a structure having a three-layer structure of magnetic material layer/ruthenium (Ru) layer/magnetic material layer, for example, (specifically, a three-layer structure of CoFe/Ru/CoFe, or a three-layer structure of CoFeB/Ru/CoFeB, for example), and having interlayer exchange coupling between the two magnetic material layers becoming antimagnetic or ferromagnetic depending on the thickness of the ruthenium layer. For instance, the structure is reported in S. S., Parkin et al., Physical Review Letters, 7 May, pp. 2304-2307 (1990). Further, a structure having the two magnetic material layers in which the antiferromagnetic coupling is obtained by the leakage field from the end surfaces of the magnetic material layers is called a magnetostatic coupling structure. As a material forming the antiferromagnetic material layer, an iron-manganese alloy, a nickel-manganese alloy, a platinum-manganese alloy, an iridium-manganese alloy, a rhodium-manganese alloy, cobalt oxide, and nickel oxide may be cited. In order to improve crystallinity of the antiferromagnetic material layer, a foundation film including Ta, Cr, Ru, Ti, or the like may be formed between the first wiring line (or the second wiring line) and the antiferromagnetic material layer. Furthermore, various magnetic semiconductors may be used, soft magnetic (soft film) or hard magnetic (hard film). The recording layer may have a single-layer configuration, a multilayer configuration formed by laminating the plural different ferromagnetic material layers as described above, or a multilayer configuration formed by laminating ferromagnetic material layers and nonmagnetic material layers.

As a material forming the tunnel insulator film in the nonvolatile memory device of the first embodiment, an insulating material such as aluminum oxide ($AlO_x$), aluminum nitride (AlN), magnesium oxide (MgO), magnesium nitride, silicon oxide, silicon nitride, $TiO_2$ or $Cr_2O_3$, Ge, NiO, $CdO_x$, $HfO_2$, $Ta_2O_5$, BN, or ZnS may be cited. The tunnel insulator film can be obtained by oxidizing or nitriding a metal film formed by a sputtering method, for example. More specifically, when aluminum oxide ($AlO_x$) or magnesium oxide (MgO) is used as the insulating material forming the tunnel insulator film, for example, a method of oxidizing aluminum or magnesium formed by a sputtering method in the atmosphere, a method of plasma-oxidizing aluminum or magnesium formed by a sputtering method in the atmosphere, a method of oxidizing aluminum or magnesium formed by a sputtering method with ICP plasma, a method of naturally oxidizing aluminum or magnesium formed by a sputtering method in oxygen, a method of oxidizing aluminum or magnesium formed by a sputtering method with oxygen radical, a method of naturally oxidizing aluminum or magnesium formed by a sputtering method in oxygen while applying ultraviolet light, a method of depositing aluminum or magnesium by a reactive sputtering method, and a method of depositing aluminum oxide ($AlO_x$) or magnesium oxide (MgO) by a sputtering method may be exemplified.

These layers can be formed by a physical vapor deposition method (PVD method) exemplified by a sputtering method, an ion beam deposition method, and a vacuum deposition method, or a chemical vapor deposition method (CVD method) represented by an ALD (Atomic Layer Deposition) method.

The first wiring line and the second wiring line, the first electrode, the second electrode have single-layer structures of copper (Cu), aluminum (Al), gold (Au), platinum (Pt), titanium (Ti), molybdenum (Mo), tantalum (Ta), tungsten (W), TiN, TiW, WN, silicide, or the like, or may have a laminated structure of a foundation layer including Cr, Ti, or the like, and a Cu layer, an Au layer, a Pt layer, or the like formed thereon. Further, the wiring lines may have single-layer structures of Ta or the like or laminated structures with Cu, Ti, or the like. These wiring lines may be formed by a PVD method exemplified by a sputtering method.

The nonvolatile memory device obtained in the above described method of manufacturing a nonvolatile memory device according to the second embodiment of the invention including the preferred modes and configurations is a so-called resistance change memory device. Note that such a nonvolatile memory device is referred to as "nonvolatile memory device of the second embodiment" for convenience.

In the nonvolatile memory device of the second embodiment, as described above, a mode in which the resistance change layer includes an ion conductor containing a metal may be employed. Specifically, the resistance change layer may include a conductive or semiconductive thin film containing one element (atom) selected from Cu, Ag, Zn and one element (atom) selected from chalcogenide elements (atoms) Te, S, Se (e.g., a thin film including GeSbTe, GeTe, GeSe, GeS, SiGeTe, SiGeSbTe or a thin film laminated structure including these films and thin films including Ag, Ag alloy, Cu, Cu alloy, Zn, Zn alloy, for example), or may have a configuration in which a film including an oxide of one or plural kinds of rare earth elements selected from La, Ce, Pr, Nd, Sm, Eu, Gd, Tb, Dy, Ho, Er, Yb, Y of rare earth elements or an oxide film of Hf, Ta, W, or the like is formed on the entire or a part in the thickness direction thereof. Note that, in this case, specifically, a configuration having a laminated structure of the first electrode, the high-resistance layer, the resistance change layer, and the second electrode may be employed. Alternatively, in the nonvolatile memory device of the second embodiment, as described above, a mode in which the resistance change layer includes a chalcogenide material may be employed, and here, as the chalcogenide material, a compound of a metal and Se or Te such as GeSbTe, ZnSe, GaSnTe may be cited. Or, in the nonvolatile memory device of the second embodiment, as described above, a mode in which the resistance change layer includes a material having colossal electro-resistance effect (CER effect) may be employed, and as the material, a ternary perovskite containing transition metal oxide ($PrCaMnO_3$ or $SrTiO_3$) may be cited or a binary transition metal oxide (CiO, NiO, CuO, $TiO_2$, $Fe_3O_4$) may be cited.

In the preferable configurations in the nonvolatile memory device of the first embodiment or the nonvolatile memory device of the second embodiment, as described above, the selection transistor of the field-effect transistor is further provided below the laminated structure. As a more specific configuration, for example, not limited to, but a configuration including a selection transistor formed on a semiconductor substrate, and a lower insulating layer covering the selection transistor, wherein a first wiring line or a first electrode is formed on the lower insulating layer, the first wiring line or the first electrode is electrically connected to the selection transistor via a connection hole (or a connection hole and a landing pad or an lower wiring line) provided in the lower insulating layer, an upper insulating layer covers the lower insulating layer and the first wiring line or the first electrode and surrounds the laminated structure, and a second wiring line or a second electrode is formed on the upper insulating layer may be exemplified.

The selection transistor may be formed by a known MIS-type FET or a MOS-type FET, for example. The connection hole that electrically connects the first wiring line or the first electrode and the selection transistor may include a high-melting-point metal or metal silicide such as polysilicon doped with impurity, tungsten, Ti, Pt, Pd, Cu, TiW, TiNW, $WSi_2$, or $MoSi_2$, and may be formed according to the PVD method exemplified by the CVD method and the sputtering method. Further, as a material forming the lower insulating layer and the upper insulating layer, silicon oxide ($SiO_2$), silicon nitride (SiN), SiON, SOG, NSG, BPSG, PSG, BSG, or LTO may be exemplified.

Example 1

Example 1 relates to a method of manufacturing a nonvolatile memory device according to the first embodiment of the invention. FIG. 1 is a schematic partial sectional view of the nonvolatile memory device of the first embodiment obtained according to a method of manufacturing a nonvolatile memory device of example 1.

The nonvolatile memory device of example 1 or example 2, which will be described later, is a nonvolatile memory device having a laminated structure 50 in which a first magnetic material layer 51, a tunnel insulator film 52, and a second magnetic material layer 53 are sequentially laminated, and information is recorded therein when an electric resistance value changes depending on the magnetic reversal state. The nonvolatile memory device of example 1 or example 2, which will be described later, further has a first wiring line 41 electrically connected to a lower part of the laminated structure 50, and a second wiring line 42 electrically connected to an upper part of the laminated structure 50.

Note that, the nonvolatile memory device of example 1 includes a spin injection magnetoresistance-effect device (spin RAM) using magnetization reversal by spin injection, and employs the in-plane magnetization system. Further, in the nonvolatile memory device of example 1, the planar shape of the region that has not been oxidized in the second magnetic material layer (recording layer) is an elongated oval shape.

In the nonvolatile memory device of example 1 or example 2, which will be described later, a connection layer (top layer) 62 including a TiN layer having a thickness of 80 nm is provided between the upper part of the laminated structure 50 and the second wiring line 42. Further, a cap layer 61 including a Ta layer having a thickness of about 5 nm is formed by a sputtering method between the laminated structure 50 and the connection layer 62. The cap layer 61 serves to prevent interdiffusion between atoms forming the second wiring line 42 and the connection layer 62 and atoms forming the second magnetic material layer 53, to reduce contact resistance, and to prevent oxidation of the second magnetic material layer 53. Note that, as the cap layer, in addition, a Ru layer, a Pt layer, an MgO layer, a laminated structure of a Ru film/Ta film may be cited.

Furthermore, in the nonvolatile memory device of example 1 or example 2, which will be described later, a selection transistor TR of a field-effect transistor is provided below the laminated structure 50 (more specifically, below the first wiring line 41). The direction in which the second wiring line (bit-line) 42 extends is in parallel to the direction in which a gate electrode 12 (that functions as a so-called word line) forming the field-effect transistor extends. Specifically, the selection transistor TR is formed in a part of a silicon semiconductor substrate 10 surrounded by a device isolation region 11, and covered by lower insulating layers 21, 23. Further, one source/drain region 14B is connected to the first wiring line 41 via a connection hole 22 of a tungsten plug. Furthermore, the other source/drain region 14A is connected to a sense line 16 via a tungsten plug 15. In the drawing, the reference numeral "13" denotes a gate insulator film.

In the schematic partial sectional view of the nonvolatile memory device of FIG. 1, for a reason of the drawing, in the upper "A" region and the lower "B" region than the dashed-dotted line, the directions in which the section of the nonvolatile memory device is seen are different by 90 degrees. That is, in the "A" region, the section of the nonvolatile memory device is seen from a first direction, and, in the "B" region, the section of the nonvolatile memory device is seen from a direction orthogonal to the first direction. Accordingly, in the drawing, the projection image in the extending direction of the second wiring line (bit-line) 42 and the projection image in the extending direction of the gate electrode 12 forming the field-effect transistor are orthogonally shown, however, they are in parallel in fact.

As shown in the conceptual diagram of FIG. 2A, in example 1, the laminated structure 50 has the following configuration and structure and is formed by a sputtering method. Note that, in a magnetization reference layer 51A, the direction of magnetization is pinned by the exchange coupling to the Pt—Mn alloy layer of an antiferromagnetic material layer 51B. Further, in the second magnetic material layer (recording layer) 53, depending on the direction in which a spin-polarized current flows, its direction of magnetization is changed to be in parallel or antiparallel to magnetization fixation.

Specifically, the spin injection magnetoresistance-effect device in example 1 has a structure in which a magnetoresistance-effect laminated film of a laminated film having a TMR effect is sandwiched by the two wiring lines 41, 42. That is, the recording layer having a function of recording information (the second magnetic material layer 53 also called a magnetization reversal layer or free layer) and the magnetization reference layer having a fixed magnetization direction and a function as a spin filter (also called an anchoring layer or a magnetization fixed layer forming the first magnetic material layer 51) have a structure laminated via the tunnel insulator film 52, and the spin-polarized current flows perpendicularly to the film surface (for example, see FIG. 2A). The size of the second magnetic material layer 53 (its schematic plan view is shown by FIG. 2B) depends on the kind and the thickness of the magnetic material forming the second magnetic material layer 53, and is generally 200 nm or less for promotion of single domain and reduction of critical current $I_c$ of spin injection magnetization reversal. The recording layer 53 can take two or more magnetization directions (e.g., the first direction and the second direction as two directions shown by arrows in the perpendicular directions in FIG. 2A) by suitable magnetic anisotropy, and the respective magnetization directions correspond to information to be recorded. By making the planar shape of the second magnetic material layer (recording layer) 53 an elongated oval shape, for example, shape magnetic anisotropy can be provided. That is, the recording layer 53 has an axis of easy magnetization in parallel to the first direction and the second direction and an axis of hard magnetization, and the length of the recording layer 53 along the axis of easy magnetization is longer than the length of the recording layer 53 along the axis of hard magnetization.

The magnetization reference layer 51A forming the first magnetic material layer 51 has its magnetization direction fixed by the exchange coupling to the antiferromagnetic material layer 51B forming the first magnetic material layer 51 (see FIG. 2C). A double spin filter structure with improved efficiency of spin injection magnetization reversal in which magnetization reference layers $51A_1$, $51A_2$ are provided on and under the second magnetic material layer (recording layer) 53 via tunnel insulator film $52_1$, $52_2$ is known (see FIG. 2D). Here, the reference numerals $51B_1$, $51B_2$ denote antiferromagnetic material layers. Note that, in the examples shown in FIGS. 2A, 2C, and 2D, the second magnetic material layer (recording layer) 53, the first magnetic material layer 51, and the magnetization reference layer 51A (in the case of the two layers $51A_1$, $51A_2$, one of them) may be a laminated ferrimagnetic structure. In any case, the nonvolatile magnetic memory device using spin injection magnetization reversal (spin injection magnetoresistance-effect device) has a two-terminal spin transfer device structure in which wiring lines vertically sandwich the magnetoresistance effect laminated film.

A specific configuration example of the laminated structure 50 in example 1 will be exemplified as below.
[Second Magnetic Material Layer 53]
  Co—Fe—B layer (thickness: about 2 to 5 nm)
[Tunnel Insulator Film 52]
  MgO layer (thickness: 1.0 nm)
[First Magnetic Material Layer 51]
  Magnetization reference layer 51A (multilayered film having SAF)
  Three-layer configuration of Co—Fe—B layer (upper layer)/Ru layer (middle layer)/Co—Fe layer (lower layer)
  Antiferromagnetic material layer 51B

| Upper layer | Pt—Mt alloy layer (thickness: 20 nm) |
|---|---|
| Lower layer | Ta layer (thickness: 5 nm) |

As below, a method of manufacturing the nonvolatile memory device of example 1 will be explained with reference to FIGS. 3A, 3B, 3C, 4A, and 4B. In these drawings, the component elements of the nonvolatile memory device located lower than the first wiring line 41 (the selection transistor TR etc.) are omitted.

[Step-100]

First, according to a known method, the device isolation region 11 is formed in the semiconductor substrate 10, and the selection transistor TR including the gate oxide film 13, the gate electrode 12, the source/drain regions 14A, 14B is formed in a part of the semiconductor substrate 10 surrounded by the device isolation region 11. Then, the first lower insulating layer 21 is formed, the tungsten plug 15 is formed in a part of the lower insulating layer 21 above the source/drain region 14A, and further, the sense line 16 is formed on the first lower insulating layer 21. Then, the second lower insulating layer 23 is formed on the entire surface and the connection hole 22 of the tungsten plug is formed in parts of the lower insulating layers 21, 23 above the source/drain region 14B. In this way, the selection transistor TR covered by the lower insulating layers 21, 23 can be obtained. Then, by a sputtering method, the first wiring line 41 connected to the connection hole 22 is formed on the lower insulating layer 23 (see FIG. 1 for the description).

[Step-110]

Then, on the basis of a sputtering method under the condition exemplified as below, the first magnetic material layer 51, the tunnel insulator film 52, and the second magnetic material layer 53 are sequentially formed on the entire surface, and the cap layer 61 and the connection layer 62 are further formed thereon in continuous deposition in vacuum.

[First Magnetic Material Layer]

Deposition condition of lower layer (Ta layer) of antiferromagnetic material layer Process gas: argon=100 sccm Deposition atmosphere pressure: 0.6 Pa DC power: 200 W Deposition condition of upper layer (Pt—Mn alloy layer) of antiferromagnetic material layer Process gas: argon=100 sccm Deposition atmosphere pressure: 0.6 Pa DC power: 200 W Deposition condition of magnetization reference layer Lowermost layer: Co—Fe alloy layer in thickness of 2 nm Process gas: argon=50 sccm Deposition atmosphere pressure: 0.3 Pa DC power: 100 W Middle layer: Ru layer in thickness of 1 nm Process gas: argon=50 sccm Deposition atmosphere pressure: 0.3 Pa DC power: 50 W Uppermost layer: Co—Fe—B alloy layer in thickness of 2 nm Process gas: argon=50 sccm Deposition atmosphere pressure: 0.3 Pa DC power: 100 W

[Deposition Condition of Tunnel Insulator Film (MgO Film in Thickness of 1 nm)]

Process gas: argon=100 sccm

Deposition atmosphere pressure: 1.0 Pa

RF power: 500 W

[Deposition Condition of Second Magnetic Material Layer (Co—Fe—B Alloy Layer in Thickness of 4 nm)]

Process gas: argon=50 sccm

Deposition atmosphere pressure: 0.3 Pa

DC power: 200 W

[Deposition Condition of Cap Layer (Ta Layer in Thickness of 5 nm)]

Process gas: argon=100 sccm

Deposition atmosphere pressure: 0.6 Pa

DC power: 200 W

[Deposition Condition of Connection Layer (TiN Layer in Thickness of 80 nm)]

Process gas: argon=30 sccm

Reactive gas: $N_2$=70 sccm

Deposition atmosphere pressure: 0.7 Pa

DC power: 10 kW

[Step-120]

Then, a mask layer 63 is formed on the second magnetic material layer 53. Specifically, the mask layer 63 is formed on the connection layer 62. More specifically, in order to form the mask layer 63 on the connection layer 62, an $SiO_2$ layer having a thickness of 50 nm is formed by a biased high-density plasma CVD (HDP-CVD) method under the condition exemplified as below. Then, a patterned resist layer is formed on the $SiO_2$ layer, the $SiO_2$ layer is etched by a lithography technology and a dry-etching method and the patterned mask layer 63 is obtained, and then, the resist layer is removed by oxygen plasma ashing treatment and organic cleaning aftertreatment. In this manner, the structure shown in FIG. 3A can be obtained.

[Deposition Condition of $SiO_2$ Layer Forming Mask Layer]

Process gas: monosilane/$O_2$/argon=60 sccm/120 sccm/130 sccm

RF power

Top: 1.5 kW

Side: 3 kW

[Dry Etching Condition of $SiO_2$ Layer Forming Mask Layer]

Used gas: $C_4F_8$/CO/Ar/$O_2$=10 sccm/50 sccm/200 sccm/4 sccm

RF power: 1 kW

Pressure: 5 Pa

Temperature: 20° C.

[Step-130]

Figure 3A:
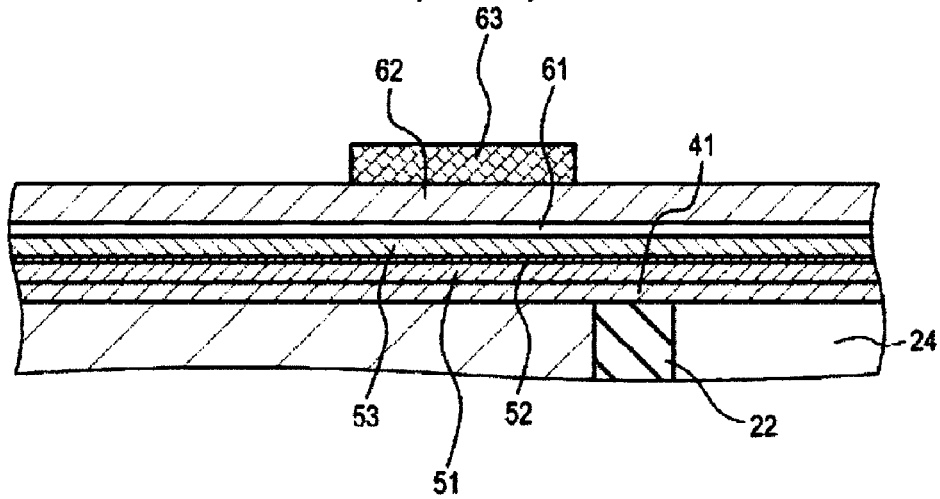
FIGS. 3A, 3B, and 3C are schematic partial sectional views of a first magnetic material layer etc. for explanation of the method of manufacturing a nonvolatile memory device of example 1.
Figure 3B:
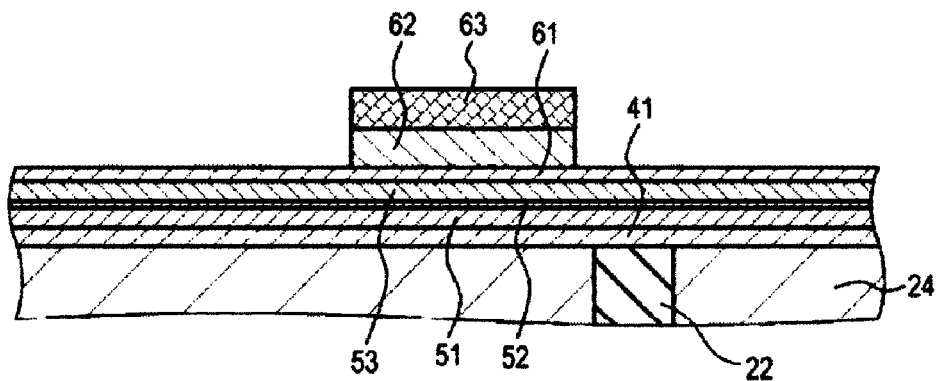
Figure 3C:
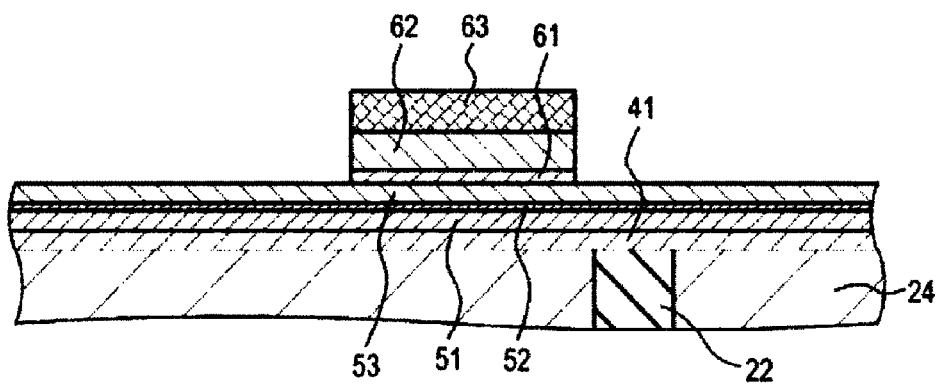

Then, the connection layer 62 is patterned based on the RIE method under the condition exemplified as below using the mask layer 63 as a mask (see FIG. 3B).

[Etching Condition of Connection Layer]

Used gas: $Cl_2$/$BCl_3$/$N_2$=60 sccm/80 sccm/10 sccm

Source power: 1 kW

Bias power: 150 W

Pressure: 1 Pa

[Step-140]

Then, a portion of the part uncovered by the mask layer 63 of the second magnetic material layer (recording layer) 53 is etched in the thickness direction. Specifically, about a half of the thickness of the cap layer 61 and the second magnetic material layer (recording layer) 53 is etched based on the ion milling method under the condition exemplified as below (see FIGS. 3C and 4A).

[Etching Condition of Cap Layer and Second Magnetic Material Layer]

Used gas: Ar=12 sccm

Pressure: 0.03 Pa

Accelerating voltage: 400 V

Accelerating current: 100 mA

Decelerating voltage: −300 V

Beam angle: −12°

Here, at the etching step of the second magnetic material layer 53, it is desirable to adjust the etching condition so that the part of the second magnetic material layer 53 may remain on the entire surface of the wafer. Note that, if, partially, the tunnel insulator film 52 as the under layer is exposed or the cap layer 61 is left, that causes little trouble. Further, the cap layer 61 and the second magnetic material layer 53 may be patterned based on the RIE method instead of patterning according to the ion milling method.

[Step-150]

Figure 4A:
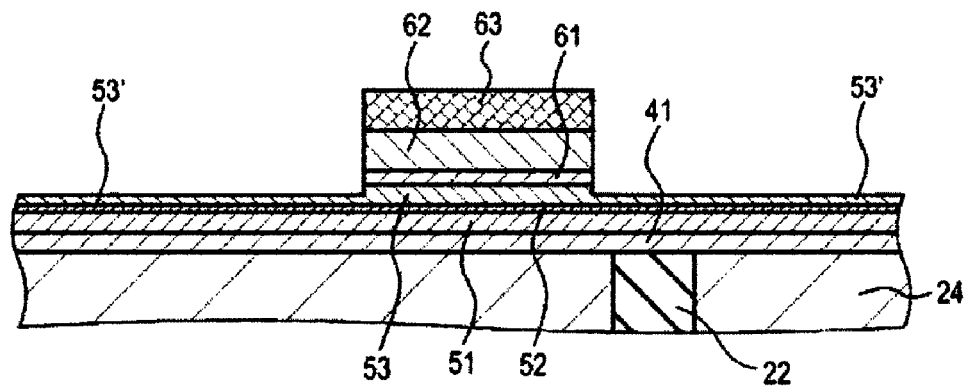
FIGS. 4A, 4B, and 4C are schematic partial sectional views of the first magnetic material layer etc. for explanation of the method of manufacturing a nonvolatile memory device of example 1 subsequent to FIG. 3C.
Figure 4B:
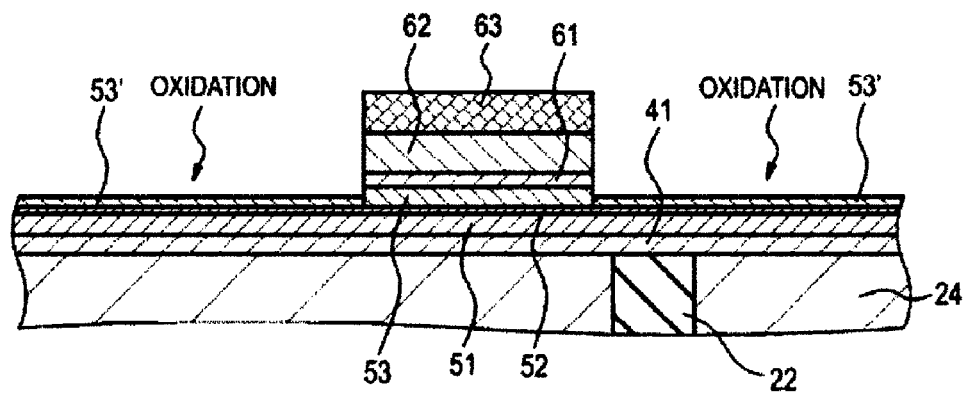

Then, the second magnetic material layer neutralization treatment of oxidizing a part 53' uncovered by the mask layer 63 of the second magnetic material layer (recording layer) 53 based on the plasma oxidation method under the condition exemplified as below (see FIG. 4B).

[Condition of Plasma Oxidation]
  RF power: 200 W
  Used gas: Ar/$O_2$=50 sccm/150 sccm

[Step-160]

Figure 4C:
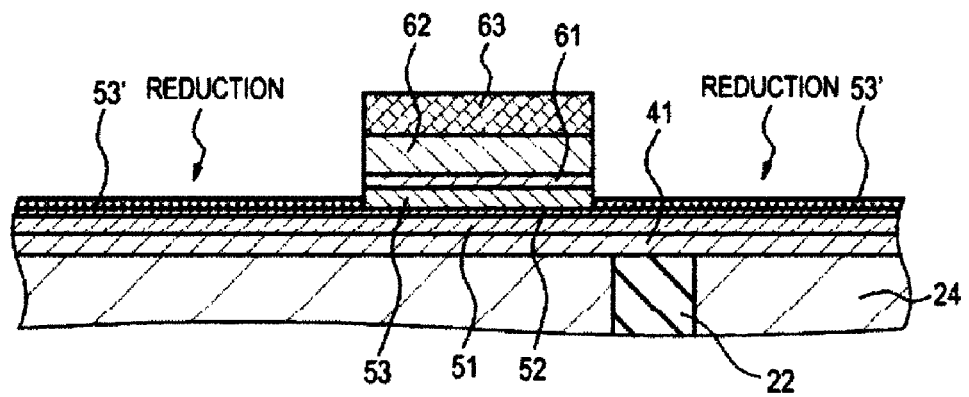

Then, reduction treatment of the oxidized part 53' of the second magnetic material layer (recording layer) 53 is performed based on the hydrogen plasma method ($H_2$ plasma reduction treatment method) under the condition exemplified as below (see FIG. 4C). Note that the amount of hydrogen atoms in the oxidized part 53' of the second magnetic material layer (recording layer) 53 can be measured using an atom probe, for example.

[Condition of $H_2$ Plasma Reduction Treatment]
  RF power: 200 W
  Substrate temperature: 350 degrees
  Introduced gas: $H_2$=500 sccm
  Pressure: $8 \times 10^2$ Pa

[Step-170]

Then, a resist layer (not shown) is formed based on the lithography technology on the oxidized part 53' of the second magnetic material layer (recording layer) 53 and the mask layer 63, then, the oxidized part 53' of the second magnetic material layer (recording layer) 53, the tunnel insulator film 52, the first magnetic material layer 51, and the first wiring line 41 are patterned (etched) using the resist layer as an etching mask, and the resist layer is removed. Then, an upper insulating layer 30 including SiN is formed on the entire surface by the plasma CVD method, then, the upper insulating layer 30 and the mask layer 63 are planarized by a chemical mechanical polishing method (CMP method) and the connection layer 62 is exposed. Then, according to a known method, the second wiring line 42 is formed on the upper insulating layer 30. In this manner, the nonvolatile memory device having the structure shown in FIG. 1 can be obtained.

In the method of manufacturing the nonvolatile memory device of example 1, the part 53' uncovered by the mask layer 63 of the second magnetic material layer 53 is oxidized, and then, the oxidized part 53' of the second magnetic material layer 53 is reduced. That is, instead of removing all of the unnecessary parts by patterning the second magnetic material layer 53 using an etching method or the like, the functions (conductivity, magnetic property, etc.) of the second magnetic material layer 53 are deteriorated by oxidation. Therefore, it is difficult to cause damage on the regions of the second magnetic material layer holding the functions. Further, since the oxidized part 53' of the second magnetic material layer 53 is reduced, the problem that excessive oxygen remaining in the part 53' of the second magnetic material layer 53 is thermally diffused and causes damage on the magnetic material layer due to the process temperature in the manufacturing process after the oxidation process of the nonvolatile memory device does not arises. That is, the deterioration of the function regions due to oxygen can be prevented. Thus, variations in readout resistance values of the nonvolatile memory device can be reduced and the separation width between the high readout resistance value and the low readout resistance value can sufficiently be taken, and the incidence ratio of shorted nonvolatile memory devices can be suppressed to very small. Therefore, a nonvolatile memory device having high properties and long-term reliability can be provided.

FIGS. 5A and 5B show measurement results of a high readout resistance value (shown by "A" in FIGS. 5A and 5B) and a low readout resistance value (shown by "B" in FIGS. 5A and 5B) in the nonvolatile memory device of example 1 and in a nonvolatile memory device in related art (a nonvolatile memory device obtained by patterning of the second magnetic material layer, the tunnel insulator film, and the first magnetic material layer using the ion milling method), respectively. The horizontal axis indicates the resistance value (unit: arbitrary), and the vertical axis indicates the percentage (%) in the tested nonvolatile memory device by logarithm. From FIGS. 5A and 5B, the nonvolatile memory device of example 1 has a smaller ratio of small separation width between the high readout resistance value and the low readout resistance value than the nonvolatile memory device in related art. That is, the occurrence rate of short circuit and current leak is smaller.

Note that, although the first magnetic material layer 51 is formed by the magnetization reference layer and the second magnetic material layer 53 is formed by the recording layer, and alternatively, the first magnetic material layer 51 may be formed by the recording layer and the second magnetic material layer 53 may be formed by the magnetization reference layer. The same is applicable to example 2.

Example 2

Example 2 is a modification of example 1. In example 1, the nonvolatile memory device of the first embodiment is the spin injection magnetoresistance effect device of in-plane magnetization system. On the other hand, in example 2, the device is a spin injection magnetoresistance effect device of perpendicular magnetization system. In example 2, the planar shape of the region of the second magnetic material layer (recording layer) that has not been oxidized is circle in view of securement of workability and uniformity of the direction of the axis of easy magnetization in the second magnetic material layer (recording layer).

Specifically, the configuration of the laminated structure is as below.

Second Magnetic Material Layer (Recording Layer)
  A laminated structure of a CoFeB layer having a thickness of about 1 nm and a TbFeCo layer having a thickness of about 3 nm Tunnel Insulator Film
  An Mgo film having a thickness of 1.0 nm First Magnetic Material Layer (Magnetization Reference Layer)
  A laminated structure of a CoFeB layer having a thickness of about 1 nm and a GdFeCo layer having a thickness of about 30 nm The first magnetic material layer and the second magnetic material layer may be deposited under the sputtering condition exemplified as below, for example.

[First Magnetic Material Layer]
  Process gas: argon=50 sccm
  Deposition atmosphere pressure: 0.3 Pa
  DC power: 100 W

Figure 6A:
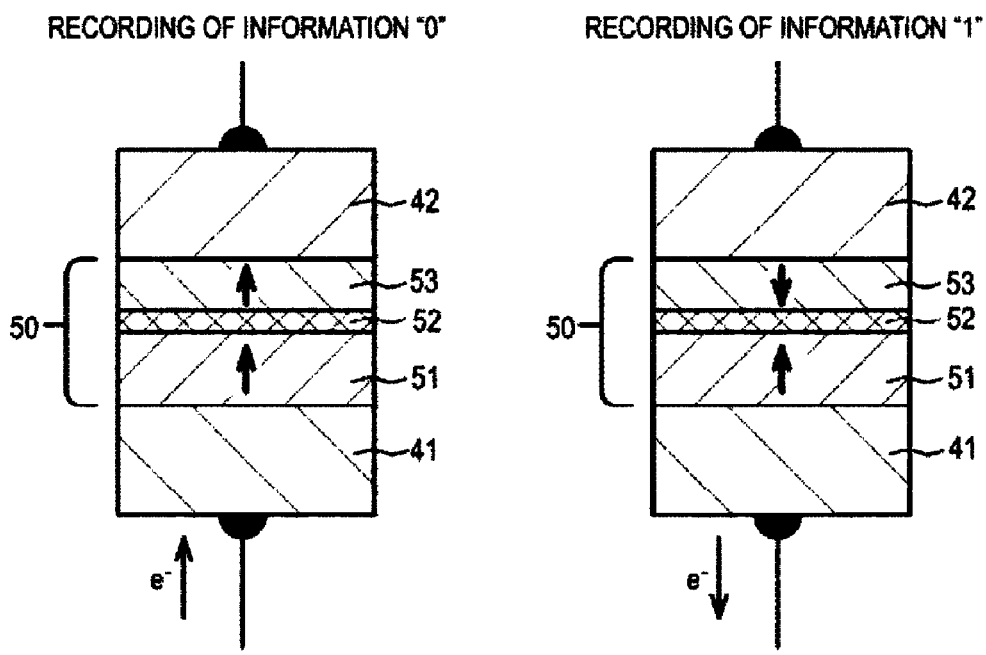
FIGS. 6A and 6B are conceptual diagrams showing a sectional structure of a laminated structure forming a nonvolatile memory device in example 2.
Figure 6B:
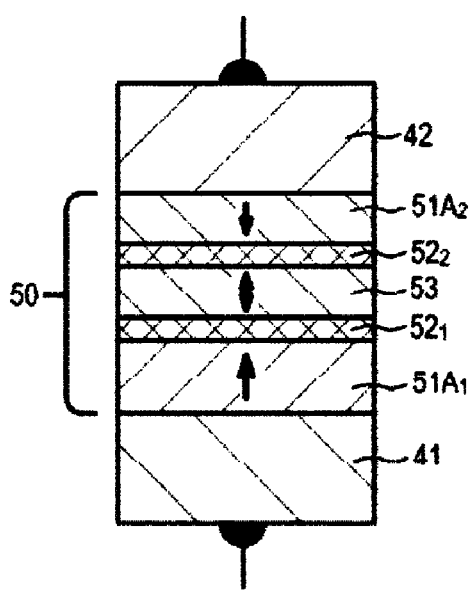

[Second Magnetic Material Layer]
  Process gas: argon=50 sccm
  Deposition atmosphere pressure: 0.3 Pa
  DC power: 200 W Example 2 has a structure in which the recording layer (second magnetic material layer 53) having a function of recording information, and the magnetization reference layer (forming the first magnetic material layer 51) that has the magnetization direction fixed and functions as a spin filter are laminated via the tunnel insulator film 52, and a spin-polarized current flows perpendicularly to the film surface (see FIG. 6A). The second magnetic material layer 53 takes plural magnetization directions equal to or more than two by suitable magnetic anisotropy (for example, the upward direction and the downward direction as two directions shown by perpendicular arrows in FIG. 6A), and the respective magnetization directions correspond to information to be recorded. The second magnetic material layer 53 has an axis of easy magnetization in parallel to the upward direction and the downward direction and an axis of hard magnetization orthogonal to the upward direction and the downward direction. The magnetization reference layer 51A has its magnetization direction fixed. Further, in the second magnetic material layer 53, its magnetization direction is changed to the upward direction (the direction toward the second wiring line 42) or the downward direction (the direction toward the first wiring line 41) depending on the direction in which the spin-polarized current flows. A double spin filter structure with improved efficiency of spin injection magnetization reversal in which magnetization reference layers $51A_1$, $51A_2$ are provided on and under the second magnetic material layer 53 via tunnel insulator film $52_1$, $52_2$ is also known (see FIG. 6B).

Except the above described points, the configuration, structure of the nonvolatile memory device of example 2 and the method of manufacturing the nonvolatile memory device of example 2 can be made the same as the configuration, structure of the nonvolatile memory device of example 1 and the method of manufacturing the nonvolatile memory device of example 1, and the detailed explanation is omitted.

Example 3

Figure 7A:
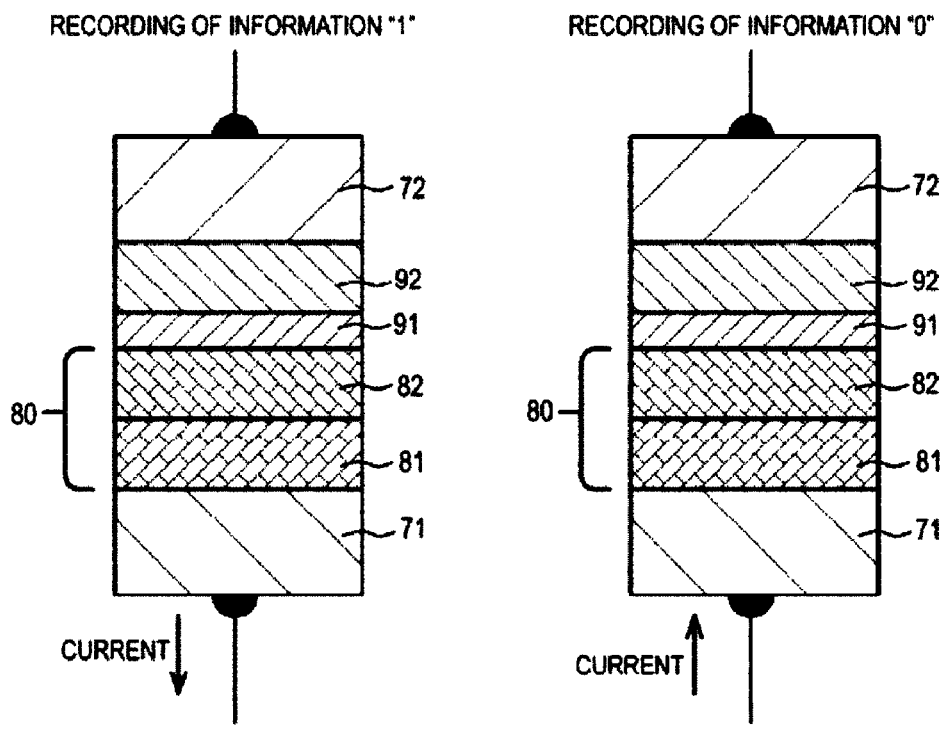
FIGS. 7A and 7B are a conceptual diagram showing a sectional structure of a laminated structure forming a nonvolatile memory device obtained using a method of manufacturing a nonvolatile memory device of example 3 and an equivalent circuit diagram.
Figure 7B:
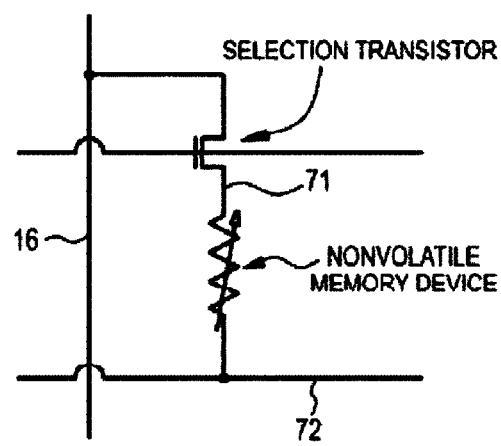

Example 3 relates to a method of manufacturing a nonvolatile memory device according to the second embodiment of the invention. FIG. 7A conceptually shows a sectional structure of a resistance change layer in the nonvolatile memory device of the second embodiment obtained in the method of manufacturing the nonvolatile memory device of example 3, and FIG. 7B shows an equivalent circuit diagram. In the nonvolatile memory device of example 3, a resistance change layer 80 includes an ion conductor containing a metal. Further, in the nonvolatile memory device of example 3, a selection transistor TR is provided. Note that the configuration, structure of the selection transistor in the nonvolatile memory device of example 3 may be made the same as the configuration, structure of the nonvolatile memory device of example 1, and the arrangement relation between the nonvolatile memory device of example 3 and the selection transistor may be made the same as the arrangement relation between the nonvolatile memory device of example 1 and the selection transistor. That is, the configuration and structure of the nonvolatile memory device of example 3 containing the selection transistor can be made the same as the configuration, structure of the nonvolatile memory device of example 1 containing the selection transistor except the difference of the configuration, structure of the nonvolatile memory device of example 1.

In example 3, the resistance change layer 80 is sandwiched between a first electrode (lower electrode) 71 and a second electrode (upper electrode) 72, and includes a high resistance layer 81 and an ion source layer 82 from the first electrode side. Here, the ion source layer 82 includes anion conductor containing a metal. Further, on the ion source layer 82, a cap layer 91 and a connection layer (top layer) 92 are formed. Note that a layer functionally serves both the cap layer and the connection layer may be formed. The first electrode (lower electrode) 71 is electrically connected to the source/drain region 14B of the selection transistor TR.

The ion source layer 82 may include a conductive or semiconductive thin film containing one metal element (atom) selected from Cu, Ag, Zn and one element (atom) selected from chalcogenide elements (atoms) Te, S, Se (e.g., a thin film including GeSbTe, GeTe, GeSe, GeS, SiGeTe, SiGeSbTe or a thin film laminated structure including these films and thin films including Ag, Ag alloy, Cu, Cu alloy, Zn, Zn alloy, for example). Further, one electrode contains metal atoms contained in the ion source layer 82. Here, Cu, Ag, Zn are elements (atoms) that easily move within the ion source layer 82 and the high resistance layer 81 when becoming cations. On the other hand, Te, S, Se are elements (atoms) that can make the resistance value of the ion source layer 82 smaller than the resistance value of the high resistance layer 81 when a current is flown in the resistance change layer 80. In the ion source layer 82, in the case where Cu or the like is used as an element to be a cation and Te or the like is used as chalcogenide element (atom), when a current is flown in the resistance change layer 80, the resistance value of the ion source layer 82 may be made sufficiently smaller than the resistance value of the high resistance layer 81 and the part where the resistance value largely changes may be limited to the ion source layer 82, and thereby, stability of the memory operation can be improved. The ion source layer 82 may include a laminated structure having two or more layers. For example, when the structure has two layers, the structure has a two-layer configuration of a thin layer containing a metal element (atom) selected from Cu, Ag, Zn and a conductive or semiconductive thin film containing one element (atom) selected from the chalcogenide elements (atoms) of Te, S, Se, and the thin film at the high resistance layer side includes a thin film containing a metal element (atom).

In the nonvolatile memory device of example 3, when a voltage is applied between the two electrodes, the metal atoms contained in the one electrode are diffused as ions in the ion source layer 82 and the electric characteristic such as the resistance value or capacity value of the ion source layer 82 changes, and thus, the memory function can be allowed to emerge using the change of the electric characteristic. Alternatively, the metal atoms in the ion source layer 82 are ionized and diffused in the high resistance layer 81, and coupled to electrons and precipitated at the negative electrode or stay diffused within the high resistance layer 81. As a result, a current path containing a large amount of metal atoms is formed within the high resistance layer 81 or many defects of metal atoms are formed within the high resistance layer 81, and the resistance value of the high resistance layer 81 becomes lower. In this regard, since the resistance value of the ion source layer 82 is originally lower compared to the resistance value before storage of information (data) of the high resistance layer 81, as the resistance value of the high resistance layer 81 becomes lower, the resistance value of the entire nonvolatile memory device also becomes lower and the memory function can be allowed to emerge. The high resistance layer 81 can be formed by a metal material, a rare earth element, oxide or nitride of mixture of them, and a semiconductor material. The first electrode (lower electrode) 71 and the second electrode (upper electrode) 72 may be formed by a metal material of aluminum (Al), copper (Cu), tungsten (W), or the like.

As below, the method of manufacturing the nonvolatile memory device of example 3 will be explained with reference to FIGS. 8A, 8B, 9A, 9B, and 10. In these drawings, the component elements of the nonvolatile memory device located lower than the first electrode 71 (the selection transistor TR etc.) are omitted.

[Step-300]

First, as is the case of example 1, the selection transistor TR is formed in the semiconductor substrate, and the first electrode 71 connected to the connection hole 22 is formed on the lower insulating layer 23 based on the sputtering method. Note that the first electrode 71 includes a WN (tungsten nitride) layer having a thickness of 20 nm.

[Step-310]

Then, on the first electrode 71, the high resistance layer 81 including gadolinium (Gd) oxide having a thickness of 3 nm, the ion source layer 82 containing Cu and Te having a thickness of 10 nm, the cap layer 91 including tungsten (W) having a thickness of 5 nm, and a connection layer 92 including TiN (titanium nitride) having a thickness of 40 nm are sequentially formed by the sputtering method.

[Step-320]

Figure 8A:
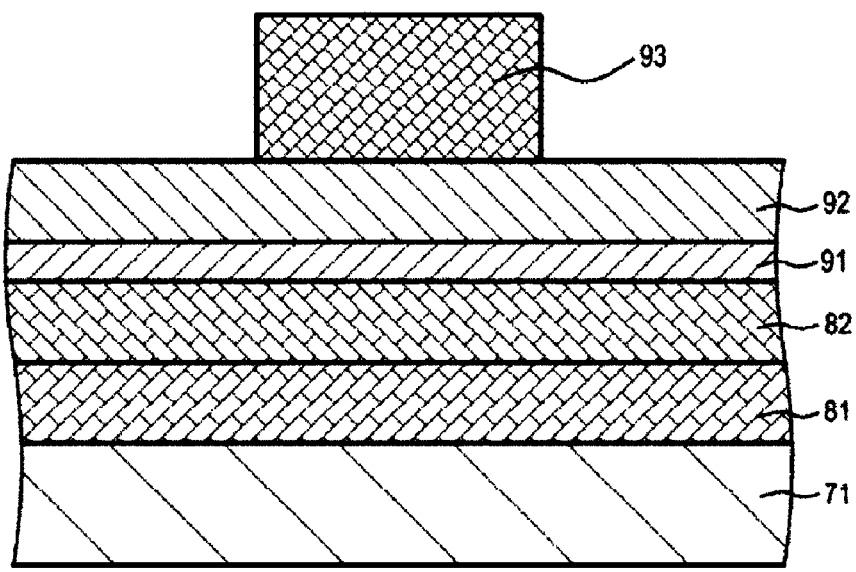
FIGS. 8A and 8B are schematic partial sectional views of a first magnetic material layer etc. for explanation of the method of manufacturing a nonvolatile memory device of example 3.
Figure 8B:
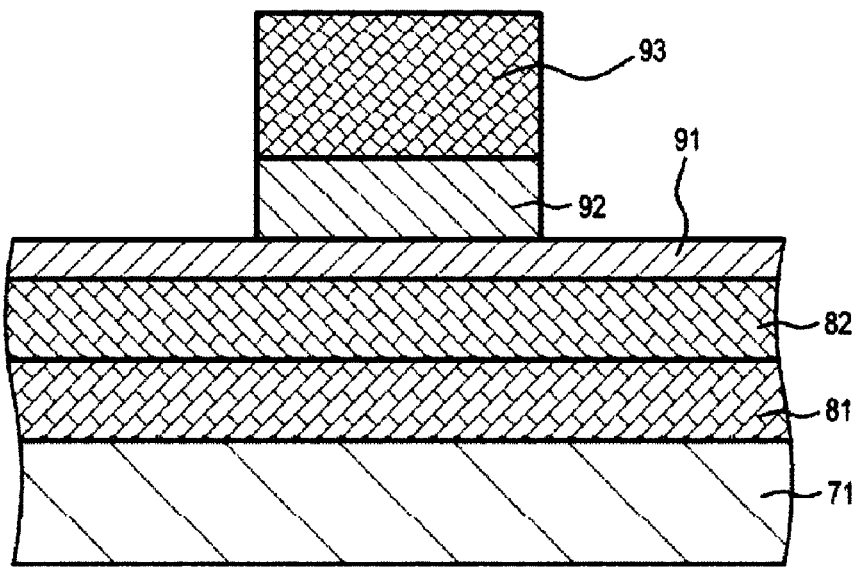

Then, in the same manner as at [step-120] of example 1, a mask layer 93 is formed on the resistance change layer 80 (see FIG. 8A). Specifically, the mask layer 93 is formed on the connection layer 92. Then, using the mask layer 93 as a mask, the connection layer 92 is patterned based on the RIE method (see FIG. 8B).

[Step-330]

Then, a part 82' uncovered by the mask layer 93 of the resistance change layer 80 is oxidized (resistance change layer neutralization treatment), and then, the oxidized part 82' of the resistance change layer 80 is reduced.

Figure 9A:
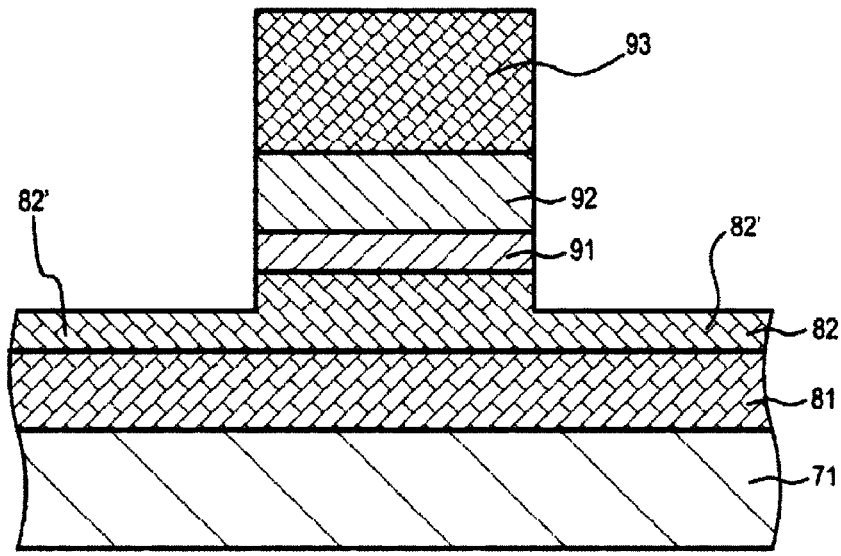
FIGS. 9A and 9B schematic partial sectional views of the first magnetic material layer etc. for explanation of the method of manufacturing a nonvolatile memory device of example 3 subsequent to FIG. 8B.

Specifically, first, about a half of the cap layer 91 and the ion source layer 82 is etched based on the ion milling method (see FIG. 9A). Here, at the etching step of the ion source layer 82, it is desirable to adjust the processing condition so that a part of the ion source layer 82 may remain on the entire surface of the wafer. Note that, if, partially, the high resistance layer 81 as the under layer is exposed or the cap layer 91 is left, that causes little trouble. Further, the cap layer 91 and the ion source layer 82 may be patterned based on the RIE method instead of patterning according to the ion milling method.

Figure 9B:
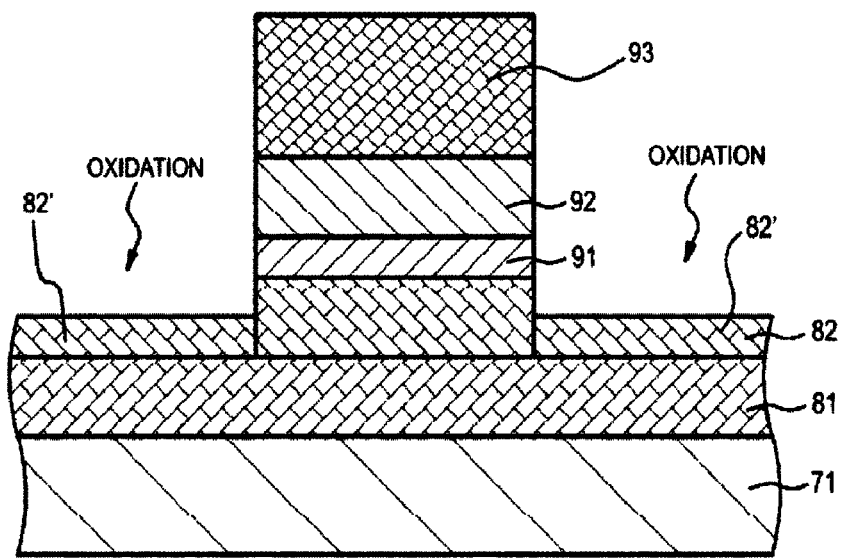

Then, the residual layer 82' of the ion source layer 82 is oxidized based on the plasma oxidation method under the condition exemplified as below (see FIG. 9B).

[Plasma Oxidation of Ion Source Layer]

RF power: 200 W
Used gas: $Ar/O_2=50/150$ sccm

Figure 10:
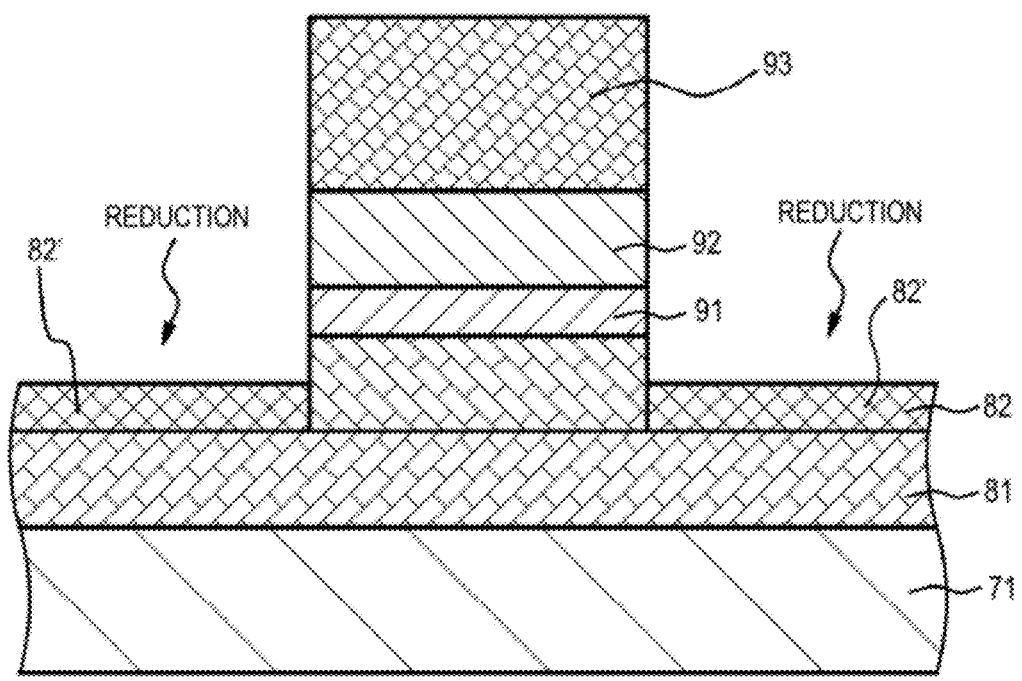
FIG. 10 is a schematic partial sectional view of the first magnetic material layer etc. for explanation of the method of manufacturing a nonvolatile memory device of example 3 subsequent to FIG. 9B.

Then, the reduction treatment is performed on the residual layer 82' of the ion source layer 82 (see FIG. 10). Specifically, a hydrogen plasma method ($H_2$ plasma reduction treatment method) under the condition exemplified as below is performed.

[$H_2$ Plasma Reduction Treatment on Residual Layer of Ion Source Layer]

RF power: 200 W
Substrate temperature: 350° C.
Introduced gas: $H_2=500$ sccm
Pressure: $8 \times 10^2$ Pa

[Step-340]

Then, in the same manner as [step-170] of example 1, a resist layer (not shown) is formed based on the lithography technology on the residual layer 82' of the ion source layer 82 and the mask layer 93, then, the residual layer 82' of the ion source layer 82 and the first electrode 71 are patterned (etched) using the resist layer as an etching mask, and the resist layer is removed. Then, the upper insulating layer 30 including an SiN layer is formed on the entire surface by the plasma CVD method, then, the upper insulating layer 30 and the mask layer 93 are planarized by a chemical mechanical polishing method (CMP method) and the connection layer 92 is exposed. Then, according to a known method, the second electrode (upper electrode) 72 is formed on the upper insulating layer 30. In this manner, the nonvolatile memory device of example 3 can be obtained.

In the method of manufacturing the nonvolatile memory device of example 3, the part 82' uncovered by the mask layer 93 of the resistance change layer 80 is oxidized, and then, the oxidized part 82' of the resistance change layer 80 is reduced. That is, instead of removing the unnecessary parts by patterning the resistance change layer 80 using an etching method or the like, the functions (conductivity etc.) of the resistance change layer 80 are deteriorated by oxidation. Therefore, it is difficult to cause damage on the regions of the resistance change layer 80 holding the functions. Further, since the oxidized part 82' of the resistance change layer 80 is reduced, the problem that excessive oxygen remaining in the part 82' of the resistance change layer is thermally diffused and causes damage on the resistance change layer 80 due to the process temperature in the manufacturing process after the oxidation process of the nonvolatile memory device does not arises. That is, the deterioration of the function regions due to oxygen can be prevented. Thus, variations in the resistance value change of the nonvolatile memory device can be reduced, and a nonvolatile memory device having high properties and long-term reliability can be provided.

Next, an operation of the nonvolatile memory device of example 3 will be explained.

[Writing of Information]

When a positive potential (plus potential) is applied to the second electrode 72 and a negative potential (minus potential) or a zero potential is applied to the first electrode 71, the metal atoms are ionized from the ion source layer 82 and diffused within the high resistance layer 81, and coupled to electrons and precipitated at the first electrode side or stay diffused within the high resistance layer 81. As a result, a current path containing a large amount of metal atoms is formed within the high resistance layer 81 or many defects of metal atoms are formed within the high resistance layer 81, and the resistance value of the high resistance layer 81 becomes lower. In this regard, since the resistance value of the ion source layer 82 is originally lower compared to the resistance value before recording of information (data) of the high resistance layer 81, as the resistance value of the high resistance layer 81 becomes lower, the resistance value of the entire nonvolatile memory device also becomes lower. That is, the nonvolatile memory device is turned on (in the continuity state). The resistance of the entire nonvolatile memory device is a writing resistance.

Then, when the application of the voltages to the first electrode 71 and the second electrode 72 is stopped and no voltage is applied to the nonvolatile memory device, the resistance value of the nonvolatile memory device is held lower. In this manner, recording (writing) of information (data) is performed.

[Erasing of Information]

When a negative potential (minus potential) is applied to the second electrode 72 and a positive potential (plus potential) or a zero potential is applied to the first electrode 71, the metal atoms forming the current path formed within the high resistance layer 81 or the impurity level are ionized and move within the high resistance layer 81 and return to the ion source layer 82. As a result, the current path or defects disappear from the inside of the high resistance layer 81 and the resistance value of the high resistance layer 81 becomes higher. In this regard, since the resistance value of the ion source layer 82 is originally lower, as the resistance value of the high resistance layer 81 becomes higher, the resistance value of the entire nonvolatile memory device also becomes higher. That is, the nonvolatile memory device is turned off (in the discontinuity state). The resistance of the entire nonvolatile memory device is an erasing resistance.

Then, when the application of the voltages to the first electrode 71 and the second electrode 72 is stopped and no voltage is applied to the nonvolatile memory device, the resistance value of the nonvolatile memory device is held higher. In this manner, erasing of recorded information (data) is performed.

Then, by repeatedly performing the above described processes, recording (writing) of information in the nonvolatile memory device and erasing of the recorded information can repeatedly be performed.

In this regard, for example, if the state in which the resistance of the entire nonvolatile memory device is the writing resistance (the low resistance value state) is brought into correspondence with information "1" and the state in which the resistance of the entire nonvolatile memory device is the erasing resistance (the high resistance value state) is brought into correspondence with information "0", respectively, the information stored in the nonvolatile memory device can be changed from "0" to "1" by application of the positive potential (plus potential) to the second electrode 72, and further, the information stored in the nonvolatile memory device can be changed from "1" to "0" by application of the negative potential (minus potential) to the second electrode 72.

As described above, in example 3, recording and erasing of information are performed using the nonvolatile memory device including a simple structure in which the first electrode 71, the high resistance layer 81, the ion source layer 82, and the second electrode 72 are only laminated in this order. Thus, even in the case where the nonvolatile memory device is miniaturized, recording and erasing of information can easily be performed. Further, without power supply, the resistance value of the resistance change layer 80 can be held, and the information can be saved for long periods. Further, the resistance value of the resistance change layer 80 is not changed by readout and fresh operation is not necessary, and the power consumption can be reduced by that amount.

Example 4

Example 4 is a modification of example 3. In example 4, the nonvolatile memory device includes a phase change memory device (PRAM). That is, in example 4, the resistance change layer includes a chalcogenide material. Further, the device is operated as a nonvolatile memory device using difference of several digits of electric resistance between the amorphous state and the crystal state of the phase change material forming the resistance change layer as a memory part. Specifically, when a pulsed large current is flown for a short time (for example, 200 microamperes, 20 nanoseconds), then, the memory part is rapidly cooled, and the phase change material forming the resistance change layer turns into the amorphous state and exhibits a high resistance. On the other hand, when a pulsed small current is flown for a longer time (for example, 100 microamperes, 100 nanoseconds), then, the memory part is slowly cooled, and the phase change material forming the resistance change layer turns into the crystal state and exhibits a low resistance.

Instead of forming the resistance change layer from a chalcogenide material, for example, the layer may include a material having a field induced colossal electro-resistance effect (CER effect), for example, a ternary perovskite containing transition metal oxide ($PrCaMnO_3$ or $SrTiO_3$) or a binary transition metal oxide (CiO, NiO, CuO, $TiO_2$, $Fe_3O_4$).

For example, in the case where the resistance change layer includes $TiO_2$, when "forming" process of first applying a voltage to the nonvolatile memory device is performed, plural current paths (filaments) with lower resistance are locally formed in the resistance change layer. In "reset" process, the anode side (the side to which a positive voltage is applied) of the filament is oxidized by the applied voltage and the resistance value rises into a high resistance state. As a result, the resistance value of the entire nonvolatile memory device becomes higher. That is, the nonvolatile memory device is turned off (discontinuity state). The resistance value of the entire nonvolatile memory device is an erasing resistance. In "setting" process, the anode side of the filament is reduced by Joule heat and the resistance value becomes lower again into a low resistance state. As a result, the resistance value of the entire nonvolatile memory device also becomes lower. That is, the nonvolatile memory device is turned on (continuity state). The resistance value of the entire nonvolatile memory device is a writing resistance. By repeatedly performing the above described processes, recording (writing) of information in the nonvolatile memory device and erasing of the recorded information can repeatedly be performed.

As described above, the embodiments of the invention have been explained according to the preferred examples, however, the embodiments of the invention are not limited to the examples. Various laminated structures, the used materials, etc. are explained in the examples for illustrative purpose, and changes can be made appropriately.

In the nonvolatile memory devices of example 1 to example 2, a high-polarizability layer may be provided between the magnetization reference layer 51A and the tunnel insulator film 52, or a high-polarizability layer may be provided between the recording layer 53 and the tunnel insulator film 52. The high-polarizability layer includes a magnetic metal layer containing at least on kind of device selected from a group consisting of Fe, Co, and Ni, for example. The high-polarizability layer provided between the magnetization reference layer 51A and the tunnel insulator film 52 is exchange-coupled to the magnetization reference layer 51A. On the other hand, the high-polarizability layer provided between the recording layer 53 and the tunnel insulator film 52 is exchange-coupled to the recording layer 53. By providing the high-polarizability layer in this manner, the magnetoresistance ratio can be increased. Since the high-polarizability layer typically provides in-plane magnetization in a single layer, when the perpendicular magnetization system is employed, it is necessary to adjust the magnetic thickness ratio between the magnetization reference layer 51A and the recording layer 53 in order not to lose the stability of perpendicular magnetization.

The present application contains subject matter related to that disclosed in Japanese Priority Patent Application JP 2009-204528 filed in the Japan Patent Office on Sep. 4, 2009, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A method of manufacturing a nonvolatile memory device in which information is stored when an electric resistance value changes depending on a magnetization reversal state, the nonvolatile memory device having a laminated structure in which a first magnetic material layer, a tunnel insulator film, and a second magnetic material layer are sequentially laminated, the method comprising the steps of:

sequentially forming the first magnetic material layer, the tunnel insulator film, and the second magnetic material layer;

forming a mask layer on the second magnetic material layer;

oxidizing a part not covered by the mask layer of the second magnetic material layer; and reducing the oxidized part of the second magnetic material layer, wherein,
after the mask layer is formed on the second magnetic material layer and before the part not covered by the mask layer of the second magnetic material layer is oxidized, a portion of the part not covered by the mask layer of the second magnetic material layer is etched in a thickness direction.

2. The method of manufacturing a nonvolatile memory device according to claim 1, wherein the part not covered by the mask layer of the second magnetic material layer is oxidized based on a plasma oxidation method, a thermal oxidation method, or a radical oxidation method.

3. A method of manufacturing a nonvolatile memory device in which information is stored when an electric resistance value changes depending on a magnetization reversal state, the nonvolatile memory device having a laminated structure in which a first magnetic material layer, a tunnel insulator film, and a second magnetic material layer are sequentially laminated, the method comprising the steps of:

sequentially forming the first magnetic material layer, the tunnel insulator film, and the second magnetic material layer;

forming a mask layer on the second magnetic material layer;

oxidizing a part not covered by the mask layer of the second magnetic material layer; and reducing the oxidized part of the second magnetic material layer, wherein,
after the mask layer is formed on the second magnetic material layer and before the part not covered by the mask layer of the second magnetic material layer is oxidized, a portion of the part not covered by the mask layer of the second magnetic material layer is etched in a thickness direction, and
the first magnetic material layer includes a magnetization reference layer and the second magnetic material layer includes a recording layer.

4. A method of manufacturing a nonvolatile memory device in which information is stored when an electric resistance value changes depending on a magnetization reversal state, the nonvolatile memory device having a laminated structure in which a first magnetic material layer, a tunnel insulator film, and a second magnetic material layer are sequentially laminated, the method comprising the steps of:

sequentially forming the first magnetic material layer, the tunnel insulator film, and the second magnetic material layer;

forming a mask layer on the second magnetic material layer;

oxidizing a part not covered by the mask layer of the second magnetic material layer; and reducing the oxidized part of the second magnetic material layer, wherein,
after the mask layer is formed on the second magnetic material layer and before the part not covered by the mask layer of the second magnetic material layer is oxidized, a portion of the part not covered by the mask layer of the second magnetic material layer is etched in a thickness direction, and
the first magnetic material layer includes a recording layer and the second magnetic material layer includes a magnetization reference layer.

5. A method of manufacturing a nonvolatile memory device in which information is stored when an electric resistance value changes depending on a magnetization reversal state, the nonvolatile memory device having a laminated structure in which a first magnetic material layer, a tunnel insulator film, and a second magnetic material layer are sequentially laminated, the method comprising the steps of:

sequentially forming the first magnetic material layer, the tunnel insulator film, and the second magnetic material layer;

forming a mask layer on the second magnetic material layer;

oxidizing a part not covered by the mask layer of the second magnetic material layer; and reducing the oxidized part of the second magnetic material layer, wherein,
after the mask layer is formed on the second magnetic material layer and before the part not covered by the mask layer of the second magnetic material layer is oxidized, a portion of the part not covered by the mask layer of the second magnetic material layer is etched in a thickness direction, and
the oxidized part of the second magnetic material layer is reduced based on a hydrogen plasma method.

6. A method of manufacturing a nonvolatile memory device in which information is stored when an electric resistance value of a resistance change layer changes, the method includes the steps of:

forming a mask layer on the resistance change layer;

oxidizing a part not covered by the mask layer of the resistance change layer; and reducing the oxidized part of the resistance change layer, wherein,
the resistance change layer includes a chalcogenide material.

7. A method of manufacturing a nonvolatile memory device in which information is stored when an electric resistance value of a resistance change layer changes, the method includes the steps of:

forming a mask layer on the resistance change layer;

oxidizing a part not covered by the mask layer of the resistance change layer; and reducing the oxidized part of the resistance change layer, wherein,
the resistance change layer includes a material having colossal electro-resistance effect.

8. The method of manufacturing a nonvolatile memory device according to claim 7, wherein the resistance change layer includes a perovskite containing material.

* * * * *